(12) United States Patent
Jin et al.

(10) Patent No.: US 11,251,319 B2
(45) Date of Patent: Feb. 15, 2022

(54) SOLAR CELL

(71) Applicant: LG ELECTRONICS INC., Seoul (KR)

(72) Inventors: Yoonsil Jin, Changwon-si (KR); Youngho Choe, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/196,742

(22) Filed: Nov. 20, 2018

(65) Prior Publication Data

US 2019/0088805 A1 Mar. 21, 2019

Related U.S. Application Data

(62) Division of application No. 13/426,908, filed on Mar. 22, 2012, now Pat. No. 10,164,129.

(30) Foreign Application Priority Data

Jun. 13, 2011 (KR) .......................... 10-2011-0056900

(51) Int. Cl.
*H01L 31/0224* (2006.01)
*H01L 31/0352* (2006.01)
(Continued)

(52) U.S. Cl.
CPC .............. *H01L 31/022433* (2013.01); *H01L 31/03529* (2013.01); *H01L 31/068* (2013.01);
(Continued)

(58) Field of Classification Search
CPC .......... H01L 31/022433; H01L 31/068; H01L 31/02168; H01L 31/022425; H01L 31/0684; Y02E 10/547
(Continued)

(56) References Cited

U.S. PATENT DOCUMENTS 5,681,402 A   10/1997  Ichinose et al.
6,133,119 A * 10/2000  Yamazaki ........... H01L 21/2022
                                                       438/476

(Continued)

FOREIGN PATENT DOCUMENTS

DE    43 24 647 A1   1/1994
EP    1 696 492 A1   8/2006
(Continued)

*Primary Examiner* — Jayne L Mershon
(74) *Attorney, Agent, or Firm* — Birch, Stewart, Kolasch & Birch, LLP

(57) ABSTRACT

A method for fabricating a solar cell, includes forming an emitter layer by doping a first impurity having a second conductivity type, opposite a first conductivity type, on a front surface of a substrate having the first conductivity type; forming a back surface field by doping a second impurity having the first conductivity type on a rear surface of the substrate; and forming a plurality of front finger lines in contact with the emitter layer and a plurality of rear finger lines in contact with the back surface field, wherein the emitter layer has a selective emitter structure, the back surface field has a selective back surface field structure, and the number of the plurality of rear finger lines positioned on the rear surface of the substrate is different from the number of the plurality of front finger lines positioned on a front surface of the substrate.

11 Claims, 8 Drawing Sheets

(51) Int. Cl.
*H01L 31/068* (2012.01)
*H01L 31/18* (2006.01)

(52) U.S. Cl.
CPC ........ *H01L 31/1804* (2013.01); *Y02E 10/547* (2013.01); *Y02P 70/50* (2015.11)

(58) Field of Classification Search
USPC ................................................ 136/243–265
See application file for complete search history.

(56) References Cited

U.S. PATENT DOCUMENTS

| | | | |
|---|---|---|---|
| 6,552,414 B1 | 4/2003 | Horzel et al. | |
| 2003/0102022 A1* | 6/2003 | Fath | H01L 31/068 136/256 |
| 2004/0259335 A1* | 12/2004 | Narayanan | H01L 31/068 438/584 |
| 2006/0283499 A1 | 12/2006 | Terakawa et al. | |
| 2009/0020156 A1 | 1/2009 | Ohtsuka et al. | |
| 2009/0227097 A1 | 9/2009 | Bateman et al. | |
| 2009/0288704 A1 | 11/2009 | Borden | |
| 2010/0326514 A1* | 12/2010 | Nishida | H01L 31/02168 136/256 |
| 2011/0100459 A1 | 5/2011 | Yoon et al. | |
| 2011/0139230 A1* | 6/2011 | Rohatgi | H01L 21/263 136/255 |
| 2011/0139243 A1 | 6/2011 | Shim et al. | |
| 2013/0160840 A1* | 6/2013 | Lee | H01L 31/022425 136/256 |

FOREIGN PATENT DOCUMENTS

| | | |
|---|---|---|
| EP | 2 180 520 A1 | 4/2010 |
| EP | 2 264 786 A1 | 12/2010 |
| JP | 2003-298080 A | 10/2003 |
| JP | 2009-290234 A | 12/2009 |
| JP | 2011-108985 A | 6/2011 |
| KR | 10-2008-0014751 A | 2/2008 |
| WO | WO 2010/010462 A1 | 1/2010 |

* cited by examiner (a)

(b)

(a)

(b)

(a)

(b)

(a)

(b)

SOLAR CELL

CROSS-REFERENCE TO RELATED APPLICATION

This application is a Divisional of U.S. application Ser. No. 13/426,908, filed on Mar. 22, 2012, which claims priority to Korean Patent Application No. 10-2011-0056900, filed on Jun. 13, 2011 in the Korean Intellectual Property Office, all of which are hereby incorporated herein by reference into the present application.

BACKGROUND OF THE INVENTION

1. Field of the Invention

Embodiments of the invention relate to a solar cell and, more particularly, to a solar cell in which a structure of an emitter layer is the same as that of a back surface field.

2. Description of the Related Art

Recently, as existing energy resources such as oil or coal are expected to be exhausted, an interest in alternative energy sources for replacing the oil or coal is increasing. In particular, a solar cell which directly converts (or transforms) solar energy into electric energy by using a semiconductor element is getting the spotlight as a next-generation cell.

Namely, a solar cell is a device for converting (or transforming) light energy into electric energy by using photovoltaic effects, and may be classified into a silicon solar cell, a thin film type solar cell, a dye-sensitized solar cell, an organic polymer type solar cell, and the like, according to constituent parts. In a solar cell, it is important to increase conversion efficiency (or transformation efficiency) in relation to a rate at which incident solar light is converted (or transformed) into electric energy.

SUMMARY OF THE INVENTION

An aspect of the invention provides a solar cell having improved photoelectric conversion efficiency.

According to an aspect of the invention, there is provided a solar cell including: a substrate having a first conductivity type; an emitter layer including a first impurity having a second conductivity type opposite the first conductivity type, doped therein, and positioned on one surface of the substrate; a plurality of front finger lines connected with the emitter layer; a back surface field positioned on the other surface of the substrate facing the one surface of the substrate, and including a second impurity having the first conductivity type doped therein; and a plurality of rear finger lines connected with the back surface field, wherein the emitter layer includes first areas in contact with the plurality of front finger lines and second areas positioned between the plurality of front finger lines and having a lower doping concentration than that of the first areas, wherein the back surface field includes areas in contact with the plurality of rear finger lines, and wherein the number of the plurality of rear finger lines positioned on the other surface of the substrate and the number of the plurality of front finger lines positioned on the one surface of the substrate are different.

According to another aspect of the invention, there is provided a method for fabricating a solar cell, including: forming an emitter layer by doping a first impurity having a second conductivity type opposite a first conductivity type, on a front surface of a substrate having the first conductivity type; forming a back surface field by doping a second impurity having the first conductivity type on a rear surface of the substrate; and forming a plurality of front finger lines in contact with the emitter layer and a plurality of rear finger lines in contact with the back surface field, wherein the emitter layer has a selective emitter structure, the back surface field has a selective back surface field structure, and the number of the plurality of rear finger lines positioned on the rear surface of the substrate is different from the number of the plurality of front finger lines positioned on a front surface of the substrate.

According to embodiments of the invention, since the emitter layer and the back surface field have the same structure, the photoelectric conversion efficiency of the solar cell can be improved.

The foregoing and other objects, features, aspects and advantages of the invention will become more apparent from the following detailed description of the invention when taken in conjunction with the accompanying drawings.

DETAILED DESCRIPTION OF THE EMBODIMENTS

Figure 1:
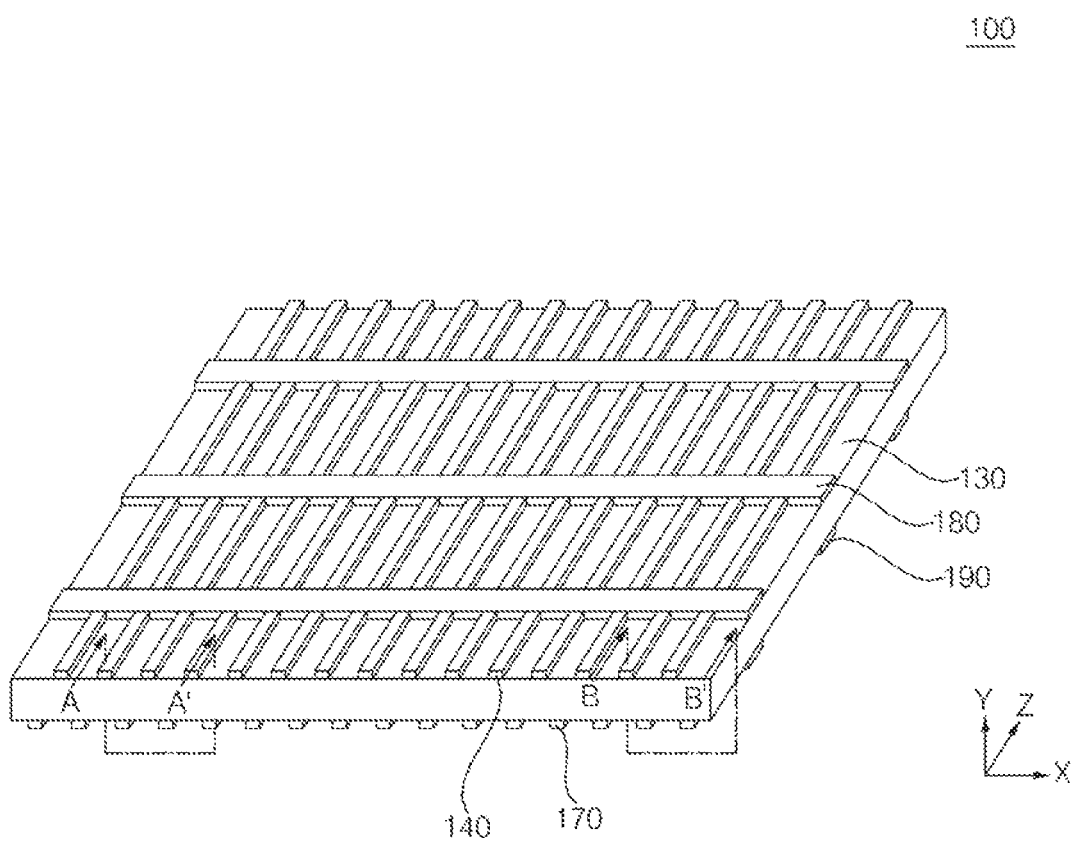
FIG. 1 is a perspective view of a solar cell according to an embodiment of the invention.

Example embodiments of the invention will now be described in detail with reference to the accompanying drawings.

It will be understood that when an element or layer is referred to as being "on" or "connected to" another element or layer, it may be directly on or directly connected to the other element or layer, or intervening elements or layers may be present, and reference for an upper or lower element or layer will be described based on the reference of the drawings. In the drawings, the shapes and dimensions may be exaggerated, omitted, or schematically illustrated for clarity.

Figure 2:
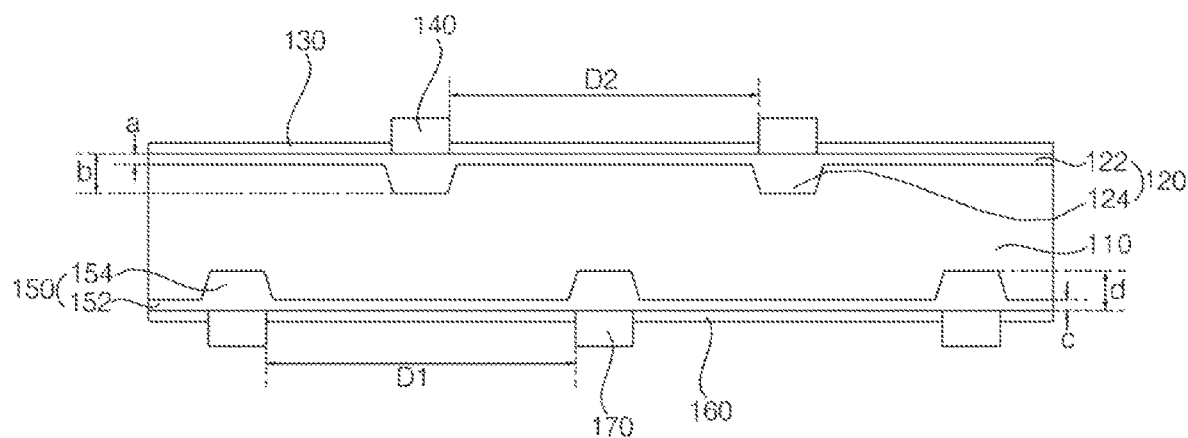
FIG. 2 is a sectional view taken along line A-A' of the solar cell of FIG. 1.
Figure 3:
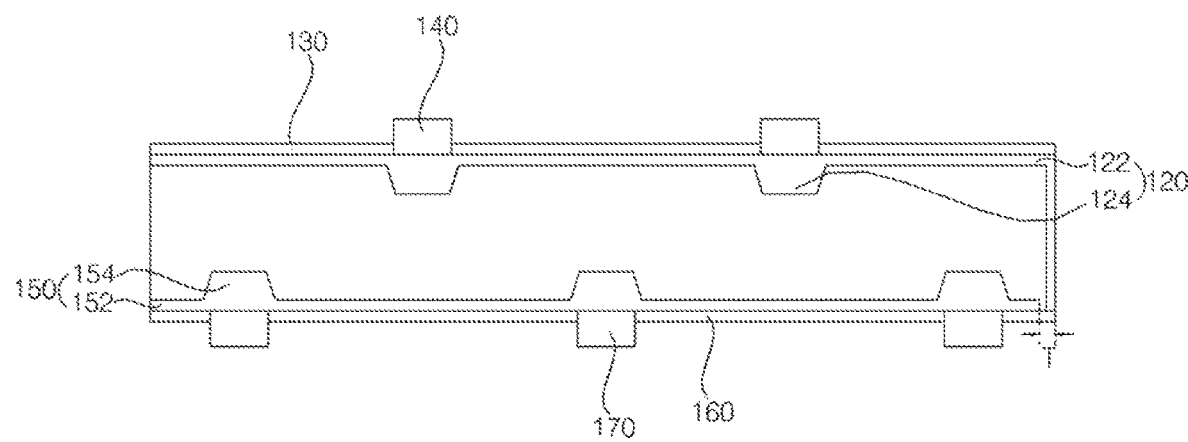
FIG. 3 is a sectional view taken along line B-B' of the solar cell of FIG. 1.

FIG. 1 is a perspective view of a solar cell according to an embodiment of the invention. FIG. 2 is a sectional view taken along line A-A' of the solar cell of FIG. 1. FIG. 3 is a sectional view taken along line B-B' of the solar cell of FIG. 1. In this instance, FIGS. 2 and 3 are sectional views in a Z direction after cutting the solar cell of FIG. 1 into an X-Y plane.

With reference to FIGS. 1 to 3, a solar cell 100 according to an embodiment of the invention may include a first conductive silicon semiconductor substrate 110, an emitter layer 120 positioned on one surface of the substrate 110, a plurality of front finger lines 140 connected with the emitter layer 120, a back surface field 150 formed on the other surface of the substrate 110, and a plurality of rear finger lines 170 connected with the back surface field 150. Also, the solar cell 100 may include a first anti-reflective film 130 on the emitter layer 120 and a second anti-reflective film 160 on the back surface field 150.

First, the substrate 110 may be made of silicon and it may have a first conductivity type based on a P type or N type impurity being doped therein. For example, a group III element, such as boron (B), gallium (Ga), indium (In), or the like, may be doped as an impurity in silicon to implement a P type substrate, and a group V element, such as phosphorus (P), arsenic (As), antimony (Sb), or the like, may be doped in silicon to implement an N type substrate.

Meanwhile, the surface of the substrate 110 may have an irregular structure (or a depression and protrusion structure). The irregular structure refers to texturing of the surface of the substrate 110 to form irregular patterns. When the substrate 110 is textured thusly, the emitter layer 120, the first anti-reflective film 130, the back surface field 150, and the second anti-reflective film 160 may be formed according to an irregular shape of the irregular patterns. Thus, the reflectance (or reflectivity) of light made incident to the solar cell 100 can be reduced and the amount of optical traps can be increased, thereby reducing an optical loss of the solar cell 100.

The emitter layer 120 is formed by doping into the substrate 110 a first impurity having a second conductivity type which is the opposite to that of the substrate 110. For example, when the substrate 110 is a P type substrate, an N type impurity is doped or included in the emitter layer 120, and when the substrate 110 is an N type substrate, a P type impurity is doped or included in the emitter layer 120. In this manner, when impurities having the mutually opposite conductivity types are doped in the substrate 110 and the emitter layer 120, respectively, a P-N junction is formed on the interface between the substrate 110 and the emitter layer 120.

Meanwhile, the emitter layer 120 may include first areas 124 in contact with the plurality of front finger lines 140 and second areas 122 disposed between the plurality of front finger lines 140, namely, between the plurality of first areas 124. The second areas 122 are not in contact with the plurality of front finger lines 140.

In general, as the impurity of the emitter layer 120 increases, a larger number of electron-hole pairs generated by a photoelectric effect can be recombined. Thus, it is advantageous for the second areas 122, in which light is largely converted into electron-hole pairs, to have a relatively low impurity concentration, while it is advantageous for the first areas 124, in which separated electrons or holes move to the front finger lines 140, to have a relatively high impurity concentration in order to reduce contact resistance.

Thus, in the solar cell 100 according to an embodiment of the invention, in order to reduce contact resistance with the front finger lines 140 and reduce or prevent a degradation of efficiency of the solar cell 100 according to the surface recombination, the solar cell 100 may have a selective emitter structure in which the first areas 124 where the front finger lines 140 are positioned are formed as a portion of the emitter layer 120 having a relatively high concentration. Accordingly, surface resistance of the first areas 124 of the emitter layer 120 is reduced to be smaller than that of the second area 122.

The first areas 124 of the emitter layer 120 may have a doping concentration ranging from 1E19 to 1E21, and the second areas 122 of the emitter layer 120 may have a doping concentration ranging from 5E18 to 1E20. In this instance, surface resistance of the first areas 124 of the emitter layer 120 may be set to range from 30 Ω/sq. to 70 Ω/sq., preferably, from 40 Ω/sq. to 70 Ω/sq., and that of the second areas 122 may be set to range from 70 Ω/sq. to 150Ω/sq., preferably, from 90 Ω/sq. to 120 Ω/sq.

Meanwhile, the thickness (b) of the first areas 124 may be greater than the thickness (a) of the second areas 122. First, the first areas 124 may be formed to have a thickness ranging from 0.5 μm to 2 μm. If the thickness (b) of the first areas 124 is smaller than 0.5 μm, a shunt may occur with the emitter layer 120 due to a fire through operation performed in forming the front finger lines 140, while if the thickness (b) of the first areas 124 is greater than 2 μm, sites of recombination of minority carriers increase to result in a greater reduction of short circuit current density (Jsc).

Also, the second areas 122 may be formed to have a thickness ranging from 0.3 μm to 1 μm. If the thickness (a) of the second areas 122 is smaller than 0.3 μm, a fill factor may be reduced due to an increase in resistance, and if the thickness (a) of the second areas 122 is greater than 1 μm, Jsc may be reduced according to an increase in the recombination.

In particular, since the front finger lines 140 are not positioned on the second areas 122, a shallow emitter can be formed. Thus, a transmission of blue light having a short wavelength may increase, improving the efficiency of the solar cell 100.

For example, the first anti-reflective film 130 may be formed as a single film made of one selected from the group consisting of silicon nitride, silicon oxide, silicon oxynitride, intrinsic amorphous silicon, $MgF_2$, ZnS, $TiO_2$, and $CeO_2$, or may have a multi-layered structure in which two or more films selected from the foregoing group are combined. When the substrate 110 is a P type substrate, the first anti-reflective film 130 may also serve as a passivation layer.

Thus, the first anti-reflective film 130 removes a recombination site of carriers existing on the surface of the emitter layer 120 or in the bulk of the emitter layer 120, and reduces reflectance of solar light made incident to a front surface of the substrate 110. Accordingly, when the recombination site of the carriers existing in the emitter layer 120 is removed, an open circuit voltage Voc of the solar cell 100 is increased. Also, when the reflectance of the solar cell is reduced, the quantity of light reaching the P-N junction is increased to increase a short circuit current Isc. When the open circuit voltage and the short circuit current of the solar cell 100 are increased, the conversion efficiency of the solar cell 100 can be improved as much.

The first anti-reflective film 130 may be formed to have a refractive index ranging from 1.8 to 2.5 and thickness ranging from 60 μm to 100 μm. If the refractive index of the first anti-reflective film 130 is smaller than 1.8, an anti-reflection effect of the first anti-reflective film 130 would not be sufficient or good, while if the refractive index of the first anti-reflective film 130 is greater than 2.5, an optical absorption occurs in the first anti-reflective film 130 in a wavelength area contributing to a current conversion of incident light and a conversion efficiency is rather degraded.

Meanwhile, when the substrate 110 is an N type substrate, a passivation layer may be formed between the emitter layer 120 and the first anti-reflective film 130. The passivation layer may be made of, for example, $SiO_x$, $Al_xO_y$, or the like.

The front finger line 140 may collect electrons or holes generated by the photoelectric effect. A plurality of front finger lines 140 may be formed.

Meanwhile, when the emitter layer 120 is a P type emitter layer, paste including AgAl, glass frit, and the like, may be screen-printed at a portion, where the front finger lines 140 are to be formed, by using a mask with an opening and then thermally treated to form the front finger lines 140 such that they are in ohmic-contact with the emitter layer 120. When the emitter layer 120 is an N type emitter layer, paste including Ag, glass frit, and the like, may be screen-printed and then thermally treated to form the front finger lines 140.

Also, the first anti-reflective film 130 and/or the passivation layer is/are irradiated with a laser beam through laser ablation so as to be removed to expose areas of the emitter layer 120, and a seed layer is deposited with nickel (Ni), or the like, on the removed areas, and then, the front finger lines 140 may be deposited through plating, sputtering, or the like, so as to be formed on the removed areas. The front finger lines 140 formed thusly may have a structure including nickel/copper/tin (Ni/Cu/Sn), nickel/silver (Ni/Ag), nickel/copper/silver (Ni/Cu/Ag), or the like, but the embodiments of the invention are not meant to be limited thereto. Also, the front finger lines 140 formed thusly may have a width of 10 μm or greater and a height (or a thickness) ranging from 60 μm to 80 μm, but the embodiments of the invention are not meant to be limited thereto. For a comparison, when not using plating, the width of the front finger lines 140 may be 30 μm to 60 μm, in cases such as double printing, light induced plating, and the like. However, embodiments of the invention may use fine lines of the finger lines 140 whereby thicknesses are less than 10 μm and doubly printed.

Meanwhile, the plurality of front finger lines 140 are in contact with front bus electrodes 180 crossing the front finger lines 140. The front bus electrodes 180 may be connected with a ribbon to supply current generated in the solar cell 100 to the exterior.

The back surface field 150, which is a highly concentrated doped area, can reduce or prevent the recombination of electron-hole pairs separated from a rear surface of the substrate 110, reduce a leakage current, and allow for obtaining improved ohmic contact characteristics. Such a back surface field 150 may be formed by doping a second impurity having the same first conductivity type as that of the substrate 110.

The back surface field 150 may have the same structure as that of the foregoing emitter layer 120. Namely, the back surface field 150 may include third areas 154 in contact with the plurality of rear finger lines 170 and fourth areas 152 disposed between the plurality of rear finger lines 170, namely, between the plurality of third areas 154. A doping concentration of an impurity of the third areas 154 may be greater than that of the impurity of the fourth areas 152. Thus, the solar cell 100 according to an embodiment of the invention may be a bifacial solar cell having the structure of the selective emitter layer 120 and the selective back surface field 150.

Meanwhile, the third areas 154 of the back surface field 150 may have a doping concentration higher than that of the fourth areas 152 in order to reduce contact resistance with the rear finger lines 170. Also, since the fourth areas 152 are formed over the entirety of the rear surface of the substrate 110, electron hole recombination can be effectively reduced or prevented.

Thus, a loss otherwise caused by electron hole recombination can be reduced, and at the same time, since the capability of transferring electrons or holes, generated in the back surface field 150 according to a photoelectric effect, to the rear finger lines 170 is further improved, the photoelectric conversion efficiency of the solar cell 100 can be further improved.

The third areas 154 of the back surface field 150 may have a doping concentration ranging from 1E19 to 1E21, and the fourth areas 122 may have a doping concentration ranging from 5E18 to 1E20. Also, a surface resistance of the third areas 154 may be set to range from 20 Ω/sq. to 70 Ω/sq., preferably, from 40 to 60 Ω/sq., and that of the fourth areas 152 may be set to range from 60 Ω/sq. to 150 Ω/sq., preferably, from 90 Ω/sq. to 120 Ω/sq.

Meanwhile, the third areas 154 may be doped to be thicker than the fourth areas 152. In order to prevent an increase in the shunt and recombination with the rear finger lines 170, the thickness (d) of the third areas 154 may range from 0.5 μm to 2 μm, and in order to reduce or prevent an increase recombination and resistance, the thickness (c) of the fourth areas 152 may range from 0.3 μm to 1 μm.

In particular, since the rear finger lines 170 are not positioned on the fourth areas 152, the back surface field 150 can be formed to be thin. Thus, a transmission of blue light of having a short wavelength may increase, improving the efficiency of the solar cell 100.

Meanwhile, FIG. 3 is a sectional view taken along line B-B' of the solar cell of FIG. 1. With reference to FIG. 3, the back surface field 150 is formed to be separated by a distance or a gap 'T' from the edge of the rear surface of the substrate 110. Thereby, an end of the back surface field 150 or a fourth area 152 is separated from an end of the emitter layer 120 or a second area 122 by an intervening portion of the substrate 110. This is to prevent a short circuit between the back surface field 150 and the emitter layer 120, since the emitter layer 120 may be formed up to the side of the substrate 110 in doping an impurity to form the emitter layer 120. Thus, an edge isolation process for preventing a short circuit between the front and rear surfaces of the substrate 110 (to be described) can be omitted.

Here, a second impurity may be included in the distance or gap T due to diffusion, or the like, between the back surface field 150 and the edge of the rear surface of the substrate 110. However, an amount of the diffusion can be negligible because it is an amount that does not cause a short circuit between the back surface field 150 and the emitter layer 120.

Meanwhile, the distance T between the back surface field 150 and the edge of the rear surface of the substrate 110 may range from 2 μm to 300 μm. If the distance T between the back surface field 150 and the edge of the rear surface of the substrate 110 is shorter than 2 μm, a short circuit would possibly occur between the back surface field 150 and the emitter layer 120 due to impurity diffusion, or the like, which may cause the efficiency of the solar cell 100 to be reduced. Meanwhile, if the distance T between the back surface field 150 and the edge of the rear surface of the substrate 110 is greater than 300 μm, the area of the rear electric field 150 would be reduced to increase recombination of electron and hole pairs, to thus, reduce the efficiency of the solar cell 100.

The second anti-reflective film 160 may be formed on the back surface field 150. The second anti-reflective film 160 may be the same as the foregoing first anti-reflective film 130. Namely, the second anti-reflective film 160 may be formed as a single film made of one selected from the group consisting of silicon nitride, silicon oxide, silicon oxynitride, intrinsic amorphous silicon, $MgF_2$, ZnS, $TiO_2$, and $CeO_2$, or may have a multi-layered structure in which two or more films selected from the foregoing group are combined, reducing reflectance of solar light made incident to the rear surface of the substrate 110. Further, when the substrate 110 is an N type substrate, the second anti-reflective film 160 may also serve as a passivation layer. The second anti-reflective film 160 may be formed to have a refractive index ranging from 1.8 to 2.5 and thickness ranging from 60 μm to 100 μm.

Meanwhile, when the substrate 110 is a P type substrate, a passivation layer may be formed between the back surface field 150 and the second anti-reflective film 160. The passivation layer may be made of, for example, SiOx, AlxOy, or the like.

A plurality of rear finger lines 170 may be formed. When the substrate 110 is an N type substrate, the rear finger lines 170 may be formed by screen-printing a paste including AgAl, glass frit, and the like, such that they are in ohmic-contact with the back surface field 150. When the substrate is a P type substrate, a paste including Ag, glass frit, and the like, may be used to form the rear finger lines 170.

Also, the second anti-reflective film 160 and/or the passivation layer is/are irradiated with a laser beam through laser ablation so as to be removed to expose areas of the back surface field 150, and a seed layer is deposited with nickel (Ni), or the like on the removed areas, and then, the second finger lines 170 may be deposited through plating, sputtering, or the like, so as to be formed on the removed areas. The second finger lines 170 formed thusly may have a structure including nickel/copper/tin (Ni/Cu/Sn), nickel/silver (Ni/Ag), nickel/copper/silver (Ni/Cu/Ag), or the like, but embodiments of the invention are not limited thereto. Also, the second finger lines 170 formed thusly may have a width of 10 μm or greater and a height ranging from 60 μm to 80 μm. When not using plating, the width of the front finger lines 140 may be 30 μm to 60 μm, in cases such as double printing, light induced plating, and the like. However, embodiments of the invention may use fine lines of the finger lines 140 whereby thicknesses are less than 10 μm and doubly printed. That is, the embodiments of the invention are not meat to be limited the above width and/or height.

The plurality of rear finger lines 170 are in contact with rear bus electrodes 190 crossing the rear finger lines 170 to supply current generated according to a photoelectric effect to the exterior.

Meanwhile, the number of the rear finger lines 170 and that of the front finger lines 140 may be different when one of them is increased. For example, the number of the rear finger lines 170 may be greater than that of the front finger lines 140.

When the number of the rear finger lines 170 is greater than that of the front finger lines 140, since a movement distance of electrons or holes to the rear finger lines 170 is shortened, overall resistance of the solar cell 100 can be reduced. Also, since there is no need to increase the number of the front finger lines 140 to reduce resistance, a light absorption to the front surface of the solar cell 100 is not additionally interfered with, thus reducing or preventing a reduction in a light absorption rate of the solar cell 100.

Also, a ratio (referred to as 'D2/D1', hereinafter) of a distance D1 between two adjacent rear finger lines 170 among the plurality of rear finger lines 170 to a distance D2 between two adjacent front finger lines 140 among the plurality of front finger lines 140 may be greater than 1 and smaller than 5.

If the distance D1 between the rear finger lines 170 is reduced to make the ratio of D2/D1 be 5 or greater, the overall area of the rear finger lines 170 would be increased to reduce an open circuit voltage Voc of the solar cell 100 according to an increase in recombination of electron and hole pairs due to a metal. Also, if the distance D2 between the front finger lines 140 is increased to make the ratio of D2/D1 be 5 or greater, a movement path of carriers up to the front finger lines 170 is increased to reduce the efficiency of the solar cell 100.

Meanwhile, if the distance D1 between the rear finger lines 170 is increased to make the ratio of D2/D1 be 1 or smaller, resistance according to an increase in the movement path of carriers would be increased to reduce the efficiency of the solar cell 100, and if the distance D2 between the front finger lines 140 is reduced to make the ratio of D2/D1 be 1 or smaller, the increased area of the front finger lines 140 would additionally interfere with solar light made incident to the rear surface to reduce Jsc. Thus, the ratio of D2/D1 may be greater than 1 and smaller than 5.

Also, the distance D1 between two adjacent rear finger lines 170 among the plurality of rear finger lines 170 may range from 0.5 μm to 2.5 μm. In this instance, the front finger lines 140 may be formed to satisfy the foregoing value of D2/D1.

If the distance D1 between rear finger lines 170 is smaller than 0.5 μm, the recombination of electron and hole pairs according to an increase in the overall area of the rear finger lines 170, and the increased area of the rear finger lines 170 would interfere with solar light made incident to the rear surface to reduce Jsc. Meanwhile, if the distance D1 between the rear finger lines 170 is greater than 2.5 μm, the fill factor would be reduced due to an increase in the resistance according to an increase in the movement path of carriers. Thus, preferably, the distance D1 between two adjacent rear finger lines 170 ranges from 0.5 μm to 2.5 μm.

FIGS. 4 to 9 are views showing processes of a method for fabricating the solar cell of FIG. 1.

Figure 4:
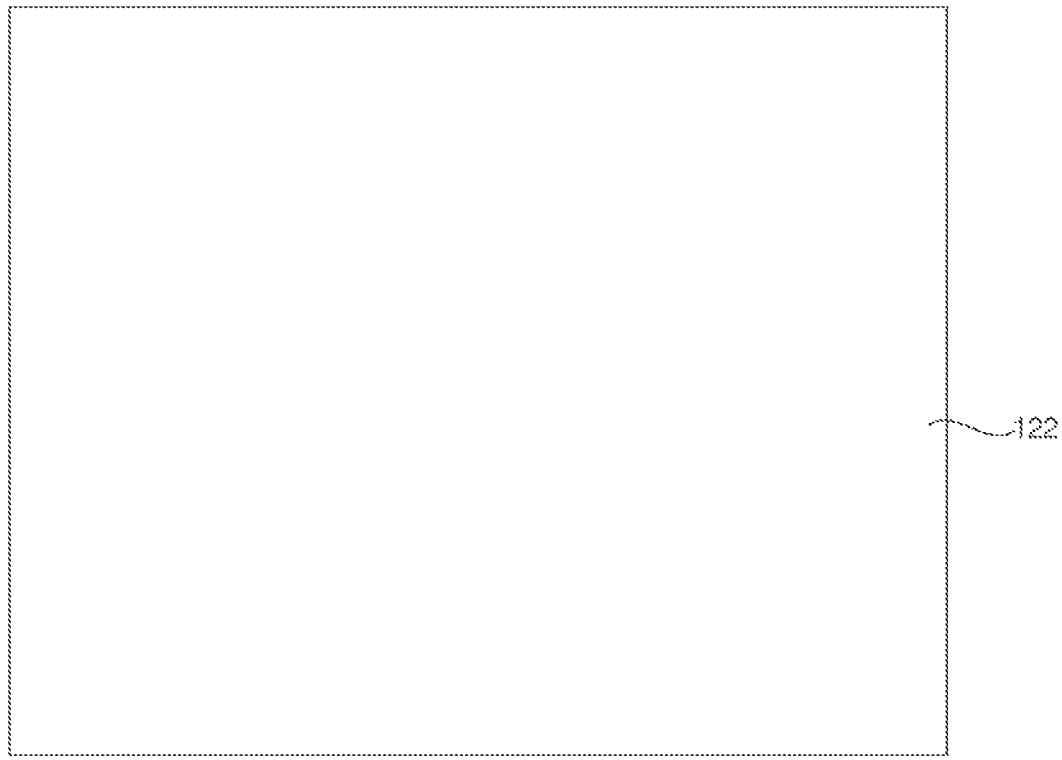
FIGS. 4 to 9 are views showing a method for fabricating the solar cell of FIG. 1.
Figure 4:
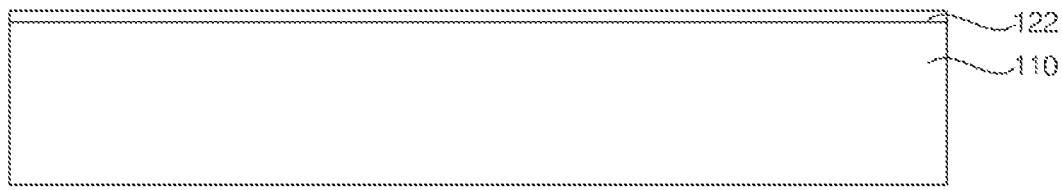

A method for fabricating the solar cell 100 according to an embodiment of the invention will now be described with reference to FIGS. 4 to 9. (a) of FIG. 4 shows a plan view of the solar cell 100 and (b) of FIG. 4 shows a side view of the solar cell 100. First, a first impurity having a second conductivity type opposite to a first conductivity type is primarily doped with a first doping concentration on the silicon semiconductor substrate 110 having the first conductivity type to form the second areas 122 of the emitter layer 120 as described above.

The substrate 110 may have an irregular structure. The irregular structure can reduce reflectance of solar light made incident to the solar cell 100, increasing the amount of optical traps and thus reducing an optical loss of the solar cell 100. The irregular structure may be formed through a process of putting the substrate 110 in etchant, or the like. The irregular structure may be formed to have various shapes such as a pyramid, a square, a triangle, or the like.

Meanwhile, the doping of the first impurity to form the second areas 122 may be performed through a thermal diffusion method, laser doping, ion implantation, or the like.

The second areas 122 may have a doping concentration ranging from 5E18 to 1E20 and a depth ranging from 0.3 μm to 1 μm.

Figure 5:
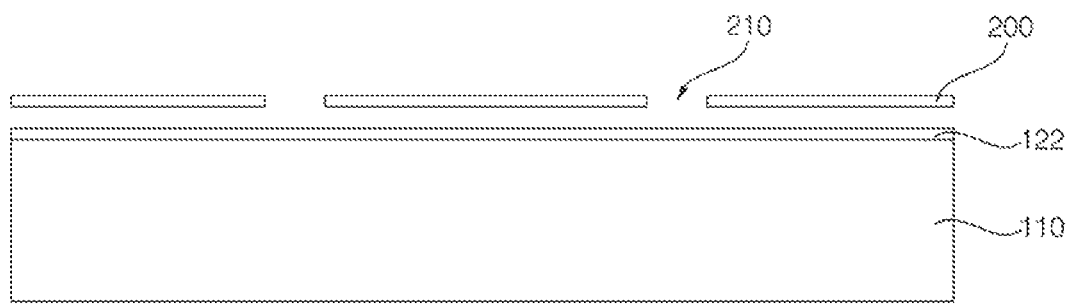
Figure 5:
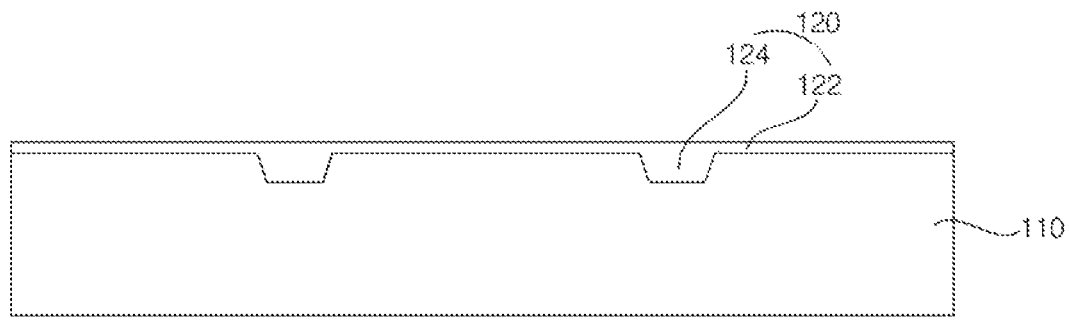

Next, (a) and (b) of FIG. 5 show side views of the solar cell 100. As shown in (a) of FIG. 5, a first mask 200 including openings 210 corresponding to positions, at which a plurality of front finger lines 140 as described above are to be formed, is positioned on the substrate 110, and the first impurity is secondarily doped through ion implantation, or the like, to form the first areas 124 of the emitter layer 120 as shown in (b) of FIG. 5.

The first areas 124 formed through the secondary doping are formed to have a second doping concentration higher than that of the second areas 122. The second doping concentration may range from 1E19 to 1E21. In this manner, contact resistance with the front finger lines 140 can be reduced (to be described). Accordingly, the selective emitter structure can be obtained.

Also, the doping thickness of the first areas 124 may range from 0.5 μm to 2 μm in order to prevent the shunt with the front finger lines 140 and to reduce or prevent an increase in the recombination of minority carriers.

Figure 6:
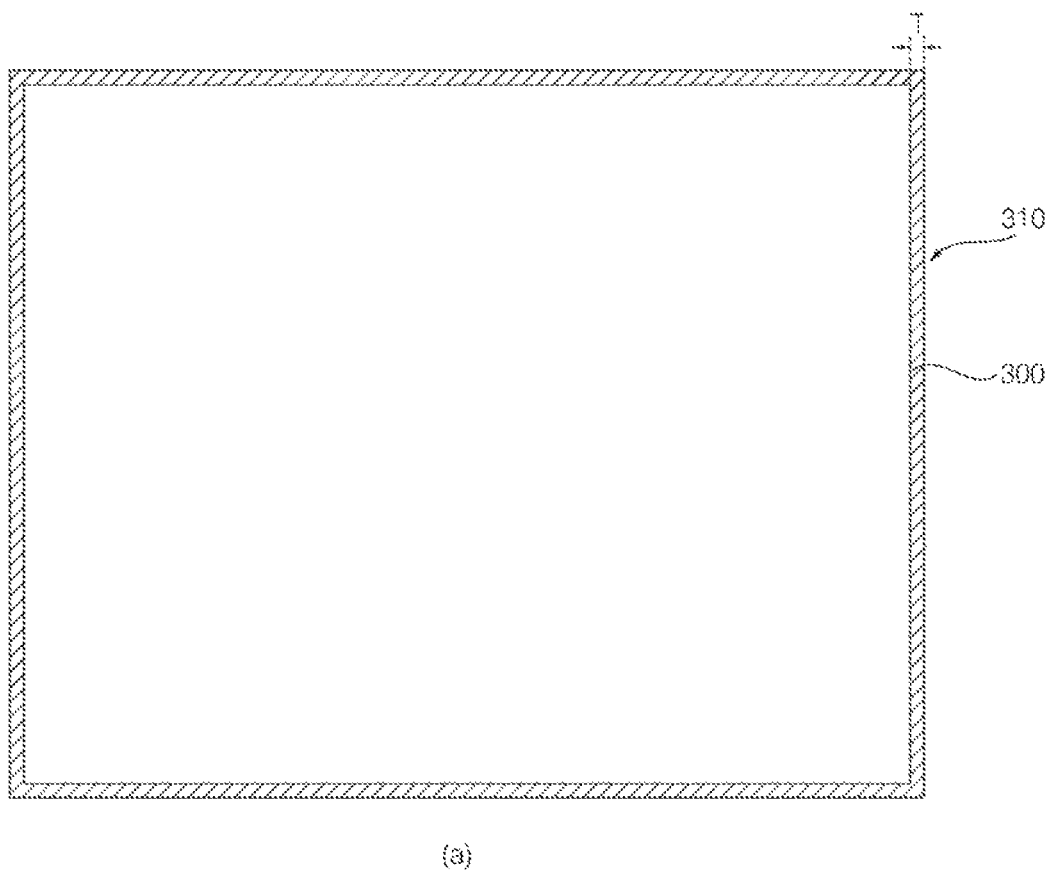
Figure 6:
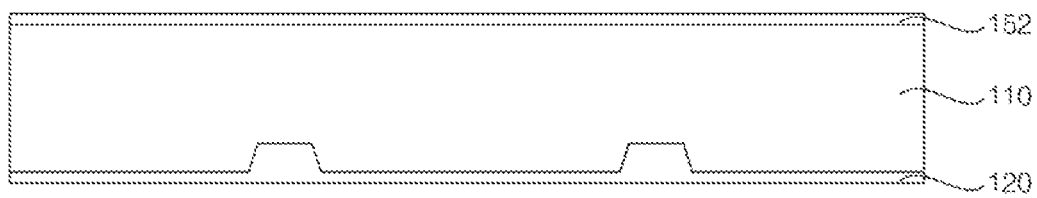

(a) of FIG. 6 shows a plan view of the solar cell 100 and (b) of FIG. 6 shows a side view of the solar cell 100. Then, as shown in FIG. 6, the fourth areas 152 (see (b) of FIG. 6) of the back surface field 150 as described above are formed by using a second mask 300 covering edges 310 (see (a) of FIG. 6) of the rear surface of the substrate 110. The second mask 300 may be in a shape of a rectangular hoop.

The fourth areas 152 reduce or prevent the recombination of electron and hole pairs separated from the rear surface of the substrate 110. The fourth areas 152 may be formed by doping the second impurity having the same conductivity type as that of the substrate 110 through a thermal diffusion method, laser doping, ion implantation, or the like. The fourth areas 152 have a doping concentration ranging from 5E18 to 1E20 and depth ranging from 0.3 μm to 1 μm.

Also, since the second mask 300 used to form the fourth areas 152 covers the areas of the substrate 110 within the distance T from the edge portion 310 on the rear surface of the substrate 110, a connection between the emitter layer 120 on the side of the substrate 110 and the fourth areas 152 can be prevented. Thus, an additional edge isolation process for insulating the front and rear surfaces of the substrate 110 can be omitted.

Accordingly, as described above with reference to FIG. 3, the back surface field 150 is formed to be separated by the distance or gap T from the edge of the rear surface of the substrate 110. In this instance, it is noted that the distance T between the back surface field 150 and the edge of the rear surface of the substrate 110 ranges from 2 μm to 300 μm. In this instance, (a) of FIG. 6 shows the section taken along line A-A' of the solar cell in FIG. 1.

Figure 7:
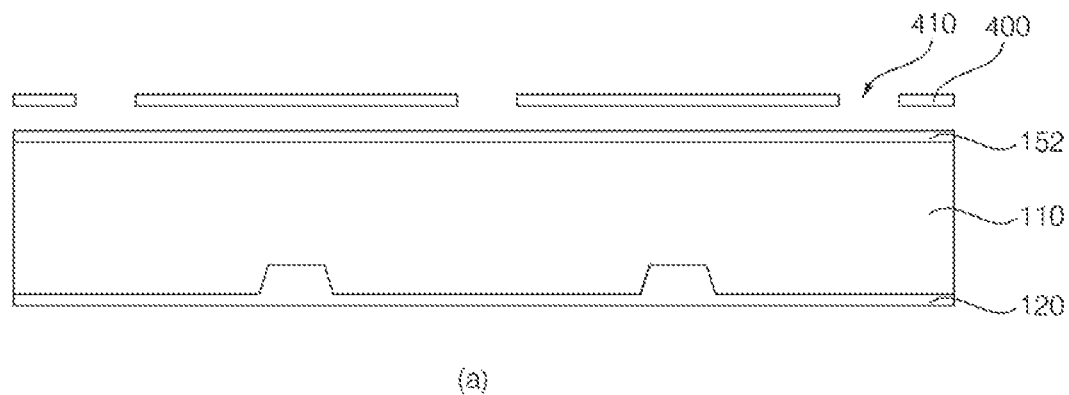
Figure 7:
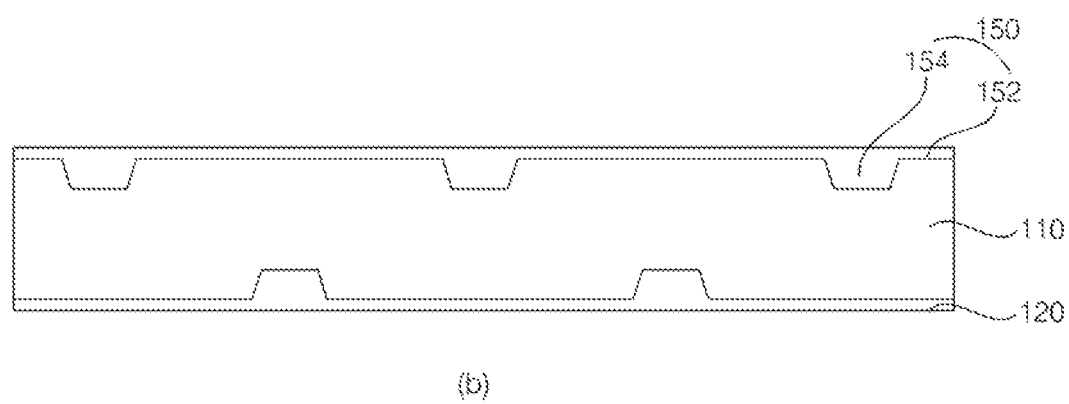

Thereafter, as shown in (a) of FIG. 7, a third mask 400 including openings 410 corresponding to positions, at which the plurality of rear finger lines 170 as described above are to be formed, is positioned on the rear surface of the substrate 110 and a second impurity is secondarily doped through ion implantation, or the like, to form, as shown in (b) of FIG. 7, the third areas 154 of the back surface field 150.

In this instance, the number of openings 410 formed on the third mask 400 may be greater than the number of openings 210 formed on the first mask 200.

The third areas 154 formed through the secondary doping are formed to have a fourth doping concentration ranging from 1E19 to 1E21 higher than that of the fourth areas 152. Thus, contact resistance with the rear finger lines 170 is reduced, improving the photoelectric conversion efficiency of the solar cell 100. Also, the back surface field 150 has the same structure as the foregoing emitter layer 120, so the solar cell 100 according to an embodiment of the invention is a bifacial solar cell having the structure of the selective emitter layer 120 and the selective back surface field 150.

Meanwhile, a doping thickness of the third areas 154 may range from 1 μm to 2 μm in order to prevent a shunt with the rear finger lines 170 and to reduce or prevent an increase in recombination of minority carriers.

The emitter layer 120 and the back surface field 150 as described above are formed by performing the doping process twice, but the embodiment of the invention are not limited thereto, and the emitter layer 120 and the back surface field 150 may be formed through, for example, ion implantation using a comb mask, or the like, at a time.

Figure 8:
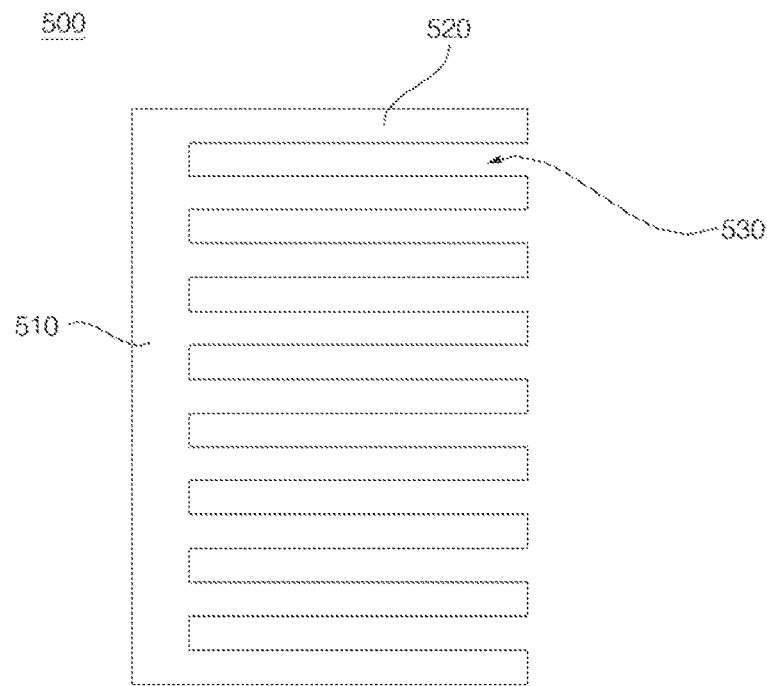

FIG. 8 shows a comb mask. With reference to FIG. 8, a combo mask 500 includes a support portion 510 and a plurality of ribs 520 extending from the support portion 510. Slots 530, i.e., openings, are formed between the ribs 520.

For example, a method for forming the emitter layer 120 by using the comb mask 500 will now be described. The position of the comb mask 500 is fixed on the substrate 110 and a first impurity is implanted into the substrate 110 through the slots 530 to form the first areas 124 of the emitter layer 120. After the formation of the first areas 124, the substrate 110 positioned under the comb mask 500 is moved and the first impurity is continuously implanted into the substrate 110 to form the second areas 122. In this instance, a doping concentration of each of the first areas 124 and the second areas 122 may be adjusted by regulating a period of time during which ions are implanted, the amount of doped ions, ion acceleration energy, and the like.

Figure 9:
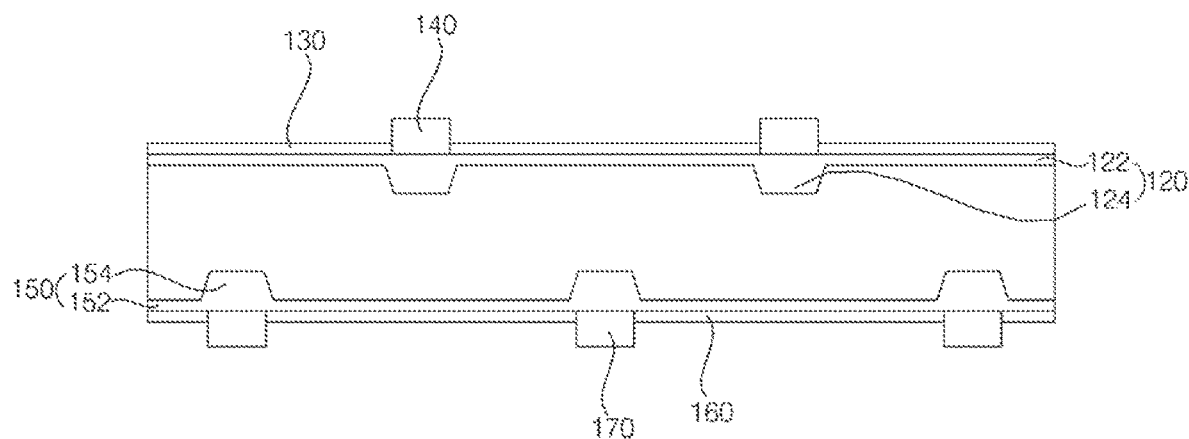

Next, as shown in FIG. 9, the first anti-reflective film 130 and the front finger lines 140 are formed on the emitter layer 120, and the second anti-reflective film 160 and the rear finger lines 170 are formed on the back surface field 150. Also, a passivation layer may be additionally formed on the emitter layer 120 and on the back surface field 150.

The first anti-reflective film 130 and the second anti-reflective film 160 may be formed through vacuum deposition, chemical vapor deposition, spin coating, screen printing, or spray coating, but the embodiments of the invention are not meant to be limited thereto.

In order to form the front finger lines 140, paste for a front electrode may be screen-printed on positions, at which the front finger lines 140 are to be formed, by using a mask and then thermally treated to form the front finger lines 140. In this instance, as silver included in the printed paste is changed into a liquid phase at a high temperature and then recrystallized into a solid phase through certain processes, the printed paste is connected with the first areas 124 of the emitter layer 120 according to a fire through phenomenon penetrating the first anti-reflective film 130.

Also, the first anti-reflective film 130 and/or the passivation layer is/are irradiated with a laser beam through laser ablation so as to be removed, and a seed layer is deposited with nickel (Ni), or the like. Then, the front finger lines 140 may be deposited through plating, sputtering, or the like, so as to be formed. Besides, the front finger lines may be also formed through laser firing, screen printing after laser ablation, or the like, but the embodiments of the invention are not meant to be limited thereto.

The rear finger lines 170 may be formed in the same manner as that of the front finger lines 140, so a detailed description thereof will be omitted.

Meanwhile, in order to reduce or prevent a reduction in resistance of the solar cell 100 and a degradation of the photoelectric conversion efficiency of the solar cell 100, the number of the rear finger lines 170 may be different from that of the front finger lines 140. For example, a larger number of rear finger lines 170 than that of the front finger lines 140 may be formed.

Also, the ratio of the distance between two adjacent rear finger lines 170 to the distance between two adjacent front finger lines 140 may be greater than 1 and smaller than 5. If the ratio of the distance between two adjacent rear finger lines 170 to the distance between two adjacent front finger lines 140 is 5 or greater, the overall area of the rear finger lines 170 would be increased to increase the recombination of electron and hole pairs due to a metal, to potentially reducing the open circuit voltage Voc of the solar cell 100. Conversely, if the ratio of the distance between two adjacent rear finger lines 170 to the distance between two adjacent front finger lines 140 is 1 or smaller, a movement path of carriers is increased to potentially reduce the efficiency of the solar cell 100.

In this instance, the distance between two adjacent rear finger lines 170 may range from 0.5 µm to 2.5 µm in order to reduce or prevent the recombination of electron and hole pairs and to reduce or prevent an increase in resistance.

Figure 10:
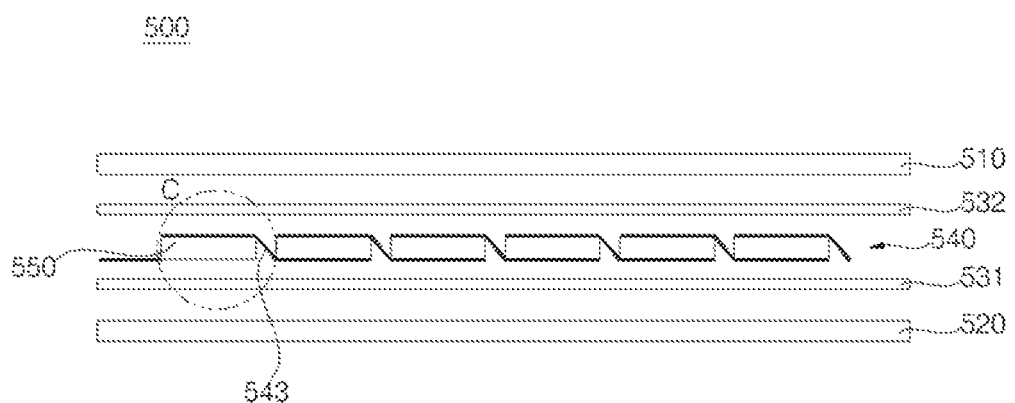
FIG. 10 is a sectional view of a solar cell module according to an embodiment of the invention.
Figure 11:
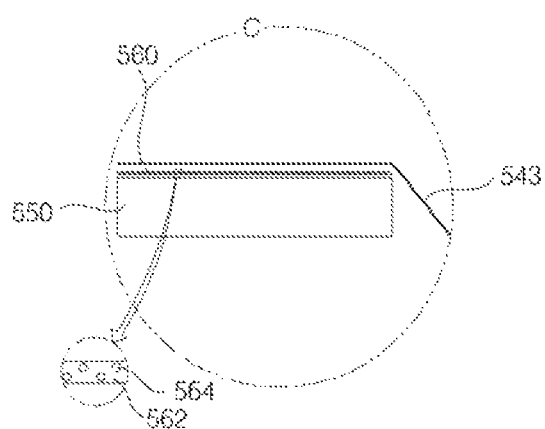
FIG. 11 is an enlarged view of a portion 'C' of the solar cell module of FIG. 10.

FIG. 10 is a sectional view of a solar cell according to an embodiment of the invention, and FIG. 11 is an enlarged view of a portion 'C' of FIG. 10. With reference to FIG. 10, a solar cell module 500 according to an embodiment of the invention may include a plurality of solar cells 550, a plurality of ribbons 543 electrically connecting the plurality of solar cells 550, a first sealing film 531 and a second sealing film 532 hermitically sealing the plurality of solar cells 550 at both (or opposite) sides, a front substrate 510 protecting one surface of each of the solar cells 550 and a rear substrate 520 protecting a rear surface of each of the solar cells 550.

The solar cells 550 are the same as described above with reference to FIGS. 1 to 3, so a detailed description thereof will be omitted. The plurality of solar cells 550 are electrically connected to each other by the ribbons 543, forming a string 540. For example, two lines of the ribbons 543 may be attached to upper and lower portions of the solar cells 550 through a tabbing process to electrically connect the plurality of solar cells 550. Namely, in performing the tabbing process, flux is applied to one surface of each of the solar cells 550, the ribbon 543 is positioned on each of the flux-applied solar cells 550, and then firing process is performed.

Or, as shown in FIG. 11, a conductive film 560 may be attached between one surface of each of the solar cells 550 and each of the ribbons 543, and be thermally compressed to connect the plurality of solar cells 550 in series or in parallel. The conductive film 560 may include a base film 562 and conductive particles 564 dispersed in the base film 562. The conductive particles 564 are exposed from the base film 562 according to (or when subjected to) the thermocompression, and the solar cells 550 and the ribbons 543 may be electrically connected by the exposed conductive particles 564.

The base film 562 may be made of a thermosetting resin having excellent bondability and insulating characteristics, e.g., an epoxy resin, an acryl resin, a polyimide resin, a polycarbonate resin, or the like, and the conductive particles 564 may be gold, silver, nickel, copper particles, or the like, having excellent conductivity. In particular, the conductive particles 564 may be particles obtained by plating the foregoing metal particles on a polymer material, or the like.

When the plurality of solar cells 550 are connected by the conductive film so as to be modularized, a processing temperature can be lowered to prevent the string 540 from being bent.

With reference back to FIG. 10, the first and second sealing films 531 and 532 hermetically seal the plurality of solar cells 550 at both (or opposite) sides thereof. The first sealing film 531 and the second sealing film 532 may be bonded by lamination to prevent penetration of moisture or oxygen which may negatively affect the solar cells 550.

Also, the first sealing film 531 and the second sealing film 532 may allow each element of the solar cells 550 to be chemically coupled. The first sealing film 531 and the second sealing film 532 may be made of an ethylene vinyl acetate copolymer (EVA) resin, polyvinyl butyral, ethylene vinyl acetate partial oxide, a silicon resin, an ester-based resin, an olefin-based resin, or the like.

The front substrate 510 is positioned on the first sealing film 531 to allow solar light to be transmitted therethrough, and it may be tempered glass in order to protect the solar cells 550 against an external impact, or the like. More preferably, the front substrate 510 may be a low iron tempered glass containing a smaller amount of iron in order to reduce or prevent a reflection of solar light and increase transmittance of solar light.

The rear substrate 520, which is to protect the solar cells 550 at the rear side of the solar cells 550, performs functions such as waterproofing, insulating, and filtering of ultraviolet rays. The rear substrate 520 may be a TPT (Tedlar/PET/Tedlar) type rear substrate, but the embodiments of the invention are not meant to be limited thereto. The rear substrate 520 may be made of a transparent material allowing solar light to be made incident thereto.

In various embodiments of the invention, a width of the plurality of front finger lines 140 may be the same or different from a width of the plurality of rear finger lines 170. Also, the number of the plurality of rear finger lines 170 positioned on the entire rear surface of the substrate 110 is different from the number of the plurality of front finger lines 140 positioned on the entire front surface of the substrate 110. Additionally, one or more of the third areas 154 of the back surface field 150 may be wider than one or more of the first areas 124 of the emitter layer 120.

As the invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a solar cell, the method comprising:
   forming an emitter layer by doping a first impurity having a second conductivity type, opposite a first conductivity type, on a front surface and a side surface of a substrate having the first conductivity type;
   forming a back surface field by doping a second impurity having the first conductivity type on a rear surface of the substrate;
   forming a plurality of front finger lines in contact with the emitter layer and a plurality of rear finger lines in contact with the back surface field;
   forming an insulating layer on the back surface field at the rear surface of the substrate,
   wherein the emitter layer has a selective emitter structure, the back surface field has a selective back surface field structure, and the number of the plurality of rear finger lines positioned on the rear surface of the substrate is different from the number of the plurality of front finger lines positioned on a front surface of the substrate,
   wherein the forming of the back surface field comprises positioning a second mask covering an edge portion of the rear surface of the substrate on the rear surface of the substrate and primarily doping the second impurity with a third doping concentration on the rear surface of the substrate,
   wherein the back surface field is separated from edges of the rear surface of the substrate to be prevented from being in contact with the emitter layer positioned on the side surface of the substrate, wherein the insulating layer directly contacts the emitter layer, the back surface of the substrate, and the back surface field at the rear surface of the substrate, wherein the emitter layer includes a plurality of first regions and a plurality of second regions, the plurality of first regions having a higher doping concentration than that of the plurality of second regions, and the back surface field includes a plurality of third regions and a plurality of fourth regions, the plurality of third regions having a higher doping concentration than that of the plurality of fourth regions, wherein the emitter layer has the selective structure in which the plurality of first regions of the emitter layer are spaced apart from each other by the plurality of second regions, the back surface field has the selective structure in which the plurality of third regions of the back surface field are separated from each other by the plurality of fourth regions, the number of the plurality of third regions is larger than the number of the plurality of first regions, and a second region of the emitter region is formed on the side surface of the substrate among the plurality of second regions, wherein the insulating layer is formed to extend from a top of a fourth region of the back surface field among the plurality of fourth regions to the edges of the rear surface of the substrate to cover the second region of the emitter layer formed on the side surface of the substrate among the plurality of second regions, and wherein each third region and each first region do not vertically overlap each other.

2. The method of claim 1, wherein the number of the plurality of rear finger lines is greater than the number of the plurality of front finger lines.

3. The method of claim 2, wherein a ratio of a distance between two adjacent rear finger lines among the plurality of rear finger lines to a distance between two adjacent front finger lines among the plurality of front finger lines is greater than 1 and smaller than 5.

4. The method of claim 1, wherein the emitter layer and the back surface field are formed through ion implantation.

5. The method of claim 1, wherein the forming of the emitter layer comprises:

primarily doping the first impurity with a first doping concentration on the entirety of the front surface of the substrate;

positioning a first mask including openings corresponding to positions at which the plurality of front finger lines are to be formed, on the substrate; and secondarily doping the first impurity with a second doping concentration higher than the first doping concentration at the positions the plurality of front finger lines are to be formed.

6. The method of claim 1, wherein the forming of the back surface field further comprises:

positioning a third mask including openings corresponding to positions at which the plurality of rear finger lines are to be formed, on the rear surface of the substrate, and secondarily doping the second impurity with a fourth doping concentration higher than the third doping concentration at the positions the plurality of rear finger lines are to be formed.

7. The method of claim 1, wherein the back surface field is separated from the edges of the rear surface of the substrate by a gap of 2 um to 300 um.

8. The method of claim 1, further comprising:

forming an anti-reflective film on the emitter layer.

9. The method of claim 8, wherein the anti-reflective film is only formed on second regions of the emitter layer positioned on the front surface among the plurality of second regions.

10. The method of claim 1, wherein the back surface field is separated from the edges of the rear surface of the substrate by a gap, and wherein the insulating layer is formed on the entire gap.

11. The method of claim 1, wherein the fourth region among the plurality of fourth regions, the rear surface of the substrate and the insulating layer contact at a first location of the substrate, wherein the second region of the emitter layer formed on the side surface of the substrate among the plurality of second regions, the rear surface of the substrate and the insulating layer contact at a second location of the substrate, and wherein the second location of the substrate is disposed between the first location of the substrate and the edges of the rear surface of the substrate.

\* \* \* \* \*